United States Patent [19]

Toor et al.

[11] Patent Number: 6,141,222

[45] Date of Patent: Oct. 31, 2000

[54] SCREWLESS TECHNIQUE FOR ATTACHING A PERIPHERAL ELECTRONIC COMPONENT TO AN ELECTRONIC SYSTEM

[75] Inventors: John Toor; Robert B. Curtis, both of Palo Alto, Calif.

[73] Assignee: Palo Alto Design Group, Palo Alto, Calif.

[21] Appl. No.: 09/177,773

[22] Filed: Oct. 23, 1998

[51] Int. Cl.[7] .............................. H05K 7/16; H05K 5/00; A47B 81/00; A47B 97/00; G06F 15/02

[52] U.S. Cl. .......................... 361/726; 361/724; 361/725; 361/726; 361/727; 361/683; 361/686; 312/223.1; 312/223.2; 364/705.01; 364/708.1

[58] Field of Search ..................................... 361/724, 725, 361/726, 727, 683, 686; 364/705.01, 708.1; 312/223.1, 223.2

[56] References Cited

U.S. PATENT DOCUMENTS

| 5,264,986 | 11/1993 | Ohgami et al. | 361/740 |
|---|---|---|---|
| 5,978,212 | 11/1999 | Boulay et al. | 361/685 |
| 6,018,457 | 1/2000 | Mroz | 361/685 |

Primary Examiner—Leo P. Picard
Assistant Examiner—Tung Minh Bui
Attorney, Agent, or Firm—Haverstock & Owens LLP

[57] ABSTRACT

An improved apparatus for and method of attaching a peripheral electronic component to an electronic system uses spring-urged protrusions to attach the peripheral electronic component to the electronic system without screws or other traditional hardware fasteners. Preferably, the spring-urged protrusions are configured to allow quick and easy installation and removal without the need for tools. Further, the apparatus is preferably configured to use standard mounting holes included in most peripheral electronic components. Therefore, the apparatus does not require costly custom modification for use with a variety of peripheral electronic components. More particularly, the apparatus is preferably electrically conductive to ground the chassis of the peripheral electronic component to the electronic system. In addition, the apparatus uses the spring-urged protrusions to reduce or eliminate the transmission of vibration between the peripheral electronic component and the electronic system. The apparatus preferably includes a manually operable mechanism for releasing the spring-urged protrusions to allow quick removal of the peripheral electronic component from the electronic system without the use of tools.

40 Claims, 10 Drawing Sheets

SCREWLESS TECHNIQUE FOR ATTACHING A PERIPHERAL ELECTRONIC COMPONENT TO AN ELECTRONIC SYSTEM

FIELD OF THE INVENTION

This invention relates to the field of attaching peripheral electronic components to electronic systems. More particularly, this invention relates to an improved technique and apparatus for removably attaching a peripheral electronic component to an electronic system without the use of screws, bolts or other traditional hardware fasteners, quickly and easily without the need for tools.

BACKGROUND OF THE INVENTION

A peripheral electronic component, such as a computer hard disk drive, floppy disk drive. Optical disk reader or an uninterruptable power supply, is conventionally mounted to an electronic system, such as a computer workstation or a personal computer, using screws and electrically coupled using cables. Typically, a peripheral electronic component is provided with threaded mounting screw holes of standard size, position and location. In addition. electronic systems are fashioned to receive peripheral electronic components by having apertures corresponding in size and location to the mounting screw holes. The peripheral electronic component can be attached to the electronic system by aligning the apertures and the mounting screw holes, inserting screws into the apertures and then using a screw driver or similar tool to advance the screws into the mounting screw holes. Similarly, the peripheral electronic component can be removed from the electronic system by using a screw driver to withdraw the screws from the screw holes and removing the screws from the apertures. However, this method proves costly due to the time that must be expended for the operation of attaching the screws.

In recent years, a rise in the number of electronic system manufacturers along with an increase in consumer demand for low prices within the computer market has increased the pressure on manufacturing operations to quickly and inexpensively assemble electronic systems. Indeed, some manufacturers of personal computers track the number of times a chassis must be touched by an operator and the length of time each chassis is touched. Electronic system manufacturers must also address the popular demand for peripheral electronic component upgrading by the end-user and the ongoing need for troubleshooting and replacing failed peripheral electronic components within an electronic systems.

SUMMARY OF THE INVENTION

An improved apparatus for and method of attaching a peripheral electronic component to an electronic system uses spring-urged protrusions to firmly attach the peripheral electronic component to the electronic system without screws or other traditional hardware fasteners. Preferably, the spring-urged protrusions are configured to allow quick and easy installation and removal without the need for tools. Further, the apparatus is preferably configured to use standard mounting holes included in most peripheral electronic components. Therefore, the apparatus does not require costly custom modification for use with a variety of peripheral electronic components. More particularly, the apparatus is preferably electrically conductive to ground the chassis of the peripheral electronic component to the electronic system. In addition, the apparatus uses the spring-urged protrusions to reduce or eliminate the transmission of vibration between the peripheral electronic component and the electronic system. The apparatus preferably includes a manually operable mechanism for releasing the spring-urged protrusions to allow quick removal of the peripheral electronic component from the electronic system without the use of tools. The present invention has the advantages of reducing assembly and service costs as well as simplifying the replacement and upgrade process.

DETAILED DESCRIPTION OF THE PREFERRED EMBODIMENT

The present invention preferably attaches a peripheral electronic component to an electronic system. More specifically, the present invention has the capability to preferably attach a peripheral electronic component to an electronic system without screws, bolts or other traditional fasteners. Preferably, the present invention accomplishes this prescribed attachment without using other traditional fasteners such as glue, adhesive, rivets, welding, clamps, cables, nails, tie wraps, etc. Further, the present invention is preferably configured to use standard threaded screw mounting holes provided on a peripheral electronic component and does not require costly custom modification for use with any standard peripheral electronic component. The following description of the preferred embodiment is not intended to limit the scope of the present invention.

Figure 1:
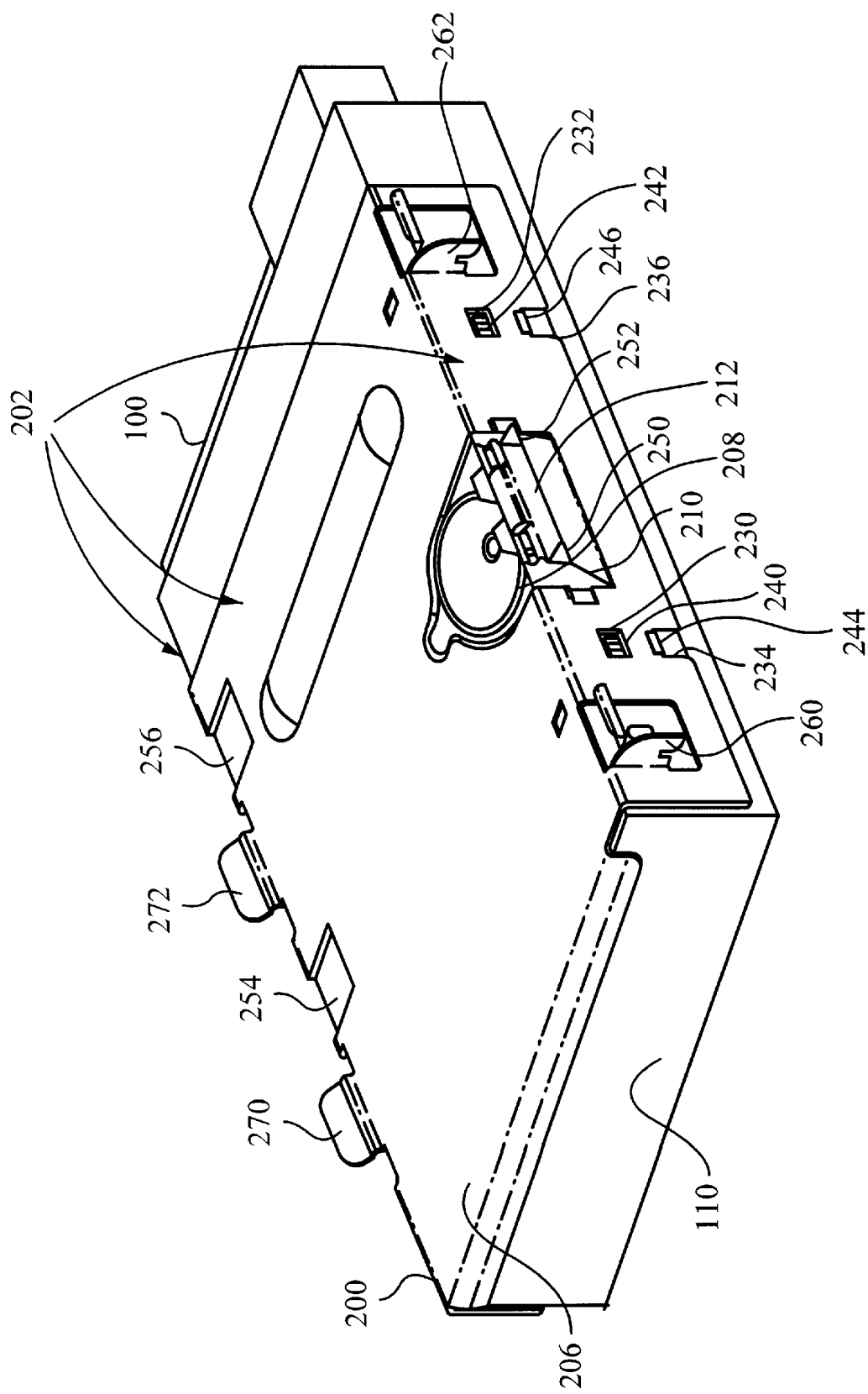
FIG. 1 illustrates a right perspective view of the preferred embodiment of the present invention in combination with a peripheral electronic component.

FIG. 1 illustrates a right perspective view of the present invention. The preferred embodiment is shown as a bracket 200. FIG. 1 shows the bracket 200 coupled to a peripheral electronic component 100. However, the bracket 200 and the peripheral electronic component 100 arc preferably easily detachable from one another. By making the bracket 200 and the peripheral electronic component 100 easily detachable, the peripheral electronic component 100 is capable of being easily removed, replaced or serviced. In addition, the bracket 200 can be reused when the peripheral electronic component fails and needs to be replaced or is upgraded. The peripheral electronic component 100 is preferably provided with an exterior enclosure 110. Further, the bracket 200 is preferably provided with an outside surface 202 and an inside surface (not visible in FIG. 1, but shown as 204 in other figures)

The bracket 200 preferably includes a bracket body 206, a spring clip 210 and a pull ring 208. As seen in FIG. 1, the spring clip 210 is attached to the bracket body 206 and configured with an integral outward spring portion 212. When at rest, the outward spring portion 212 of the spring clip 210 is protruding such that when inward pressure is applied to the outward spring portion 212, the spring clip 210 deforms and provides opposing outward pressure by its inherent attempt to return to its 'at rest' position. A plurality of outwardly spring-urged protrusions 250 and 252 are on the outward spring portion 212. In operation, when inward pressure is applied to the outward spring portion 212, the spring-urged protrusions 250 and 252 are outwardly spring-urged. Further, the pull ring 208 is attached to the outward spring portion 212 and configured to allow the outward spring portion 212 to be manually retracted by the application of inward pressure. In addition, the bracket 200 is preferably provided with one or more C-shaped protrusions 260 and 262 and one or more tab-shaped protrusions 270 and 272.

Figure 2:
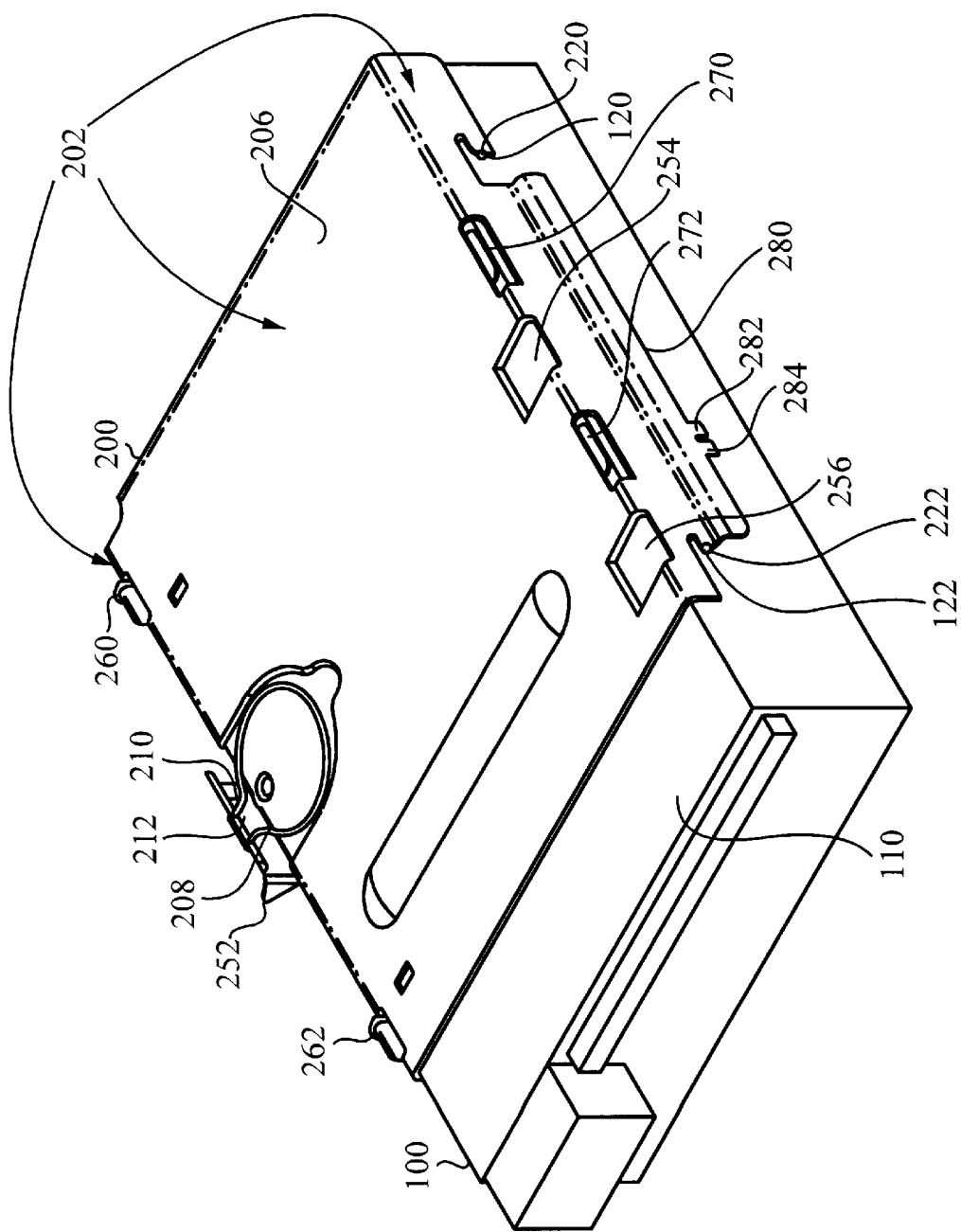
FIG. 2 illustrates a right perspective view of the preferred embodiment of the present invention, in combination with a peripheral electronic component, rotated 180 degrees from the position of the invention in FIG. 1.

FIG. 2 illustrates a right perspective view of the bracket 200 attached to the peripheral electronic component 100, with the peripheral electronic component 100 rotated 180 degrees from the position of FIG. 1. The exterior enclosure 110 of the peripheral electronic component 100 includes a plurality of first apertures 120 and 122 in predetermined first locations. The exterior enclosure 110 of the peripheral electronic component 100 also preferably includes a plurality of second apertures in predetermined second locations which are not visible in the figures. The first apertures 120 and 122 and second apertures are preferably standard threaded screw mounting holes located at industry standard locations. The bracket 200 preferably includes a horizontal edge 280 with a plurality of closely spaced tabs 282 and 284. Preferably, the bracket 200 includes a plurality of first inwardly directed protrusions 220 and 222 positioned corresponding to the locations of the first apertures 120 and 122.

As previously discussed, industry standard peripheral electronic components are typically provided with threaded screw mounting holes which are precisely dimensioned and of standard size, position and location. In addition, at least some of the screw mounting holes are provided with precisely dimensioned edges including a top edge. The precisely dimensioned top edges are location markers for locating the screw holes. As a result of precise dimensioning and standard size, location and position, the location markers on industry standard peripheral electronic components have a same location in three dimensional space. The location markers are typically provided at industry standard locations, adjacent to and a predetermined distance from the first apertures 120 and 122. Referring again to FIG. 1, the bracket 200 is also preferably provided with one or more flattened protrusions 254 and 256 which correspond to the location markers, not visible, provided on the external enclosure 110 of the peripheral electronic component 100.

Figure 3:
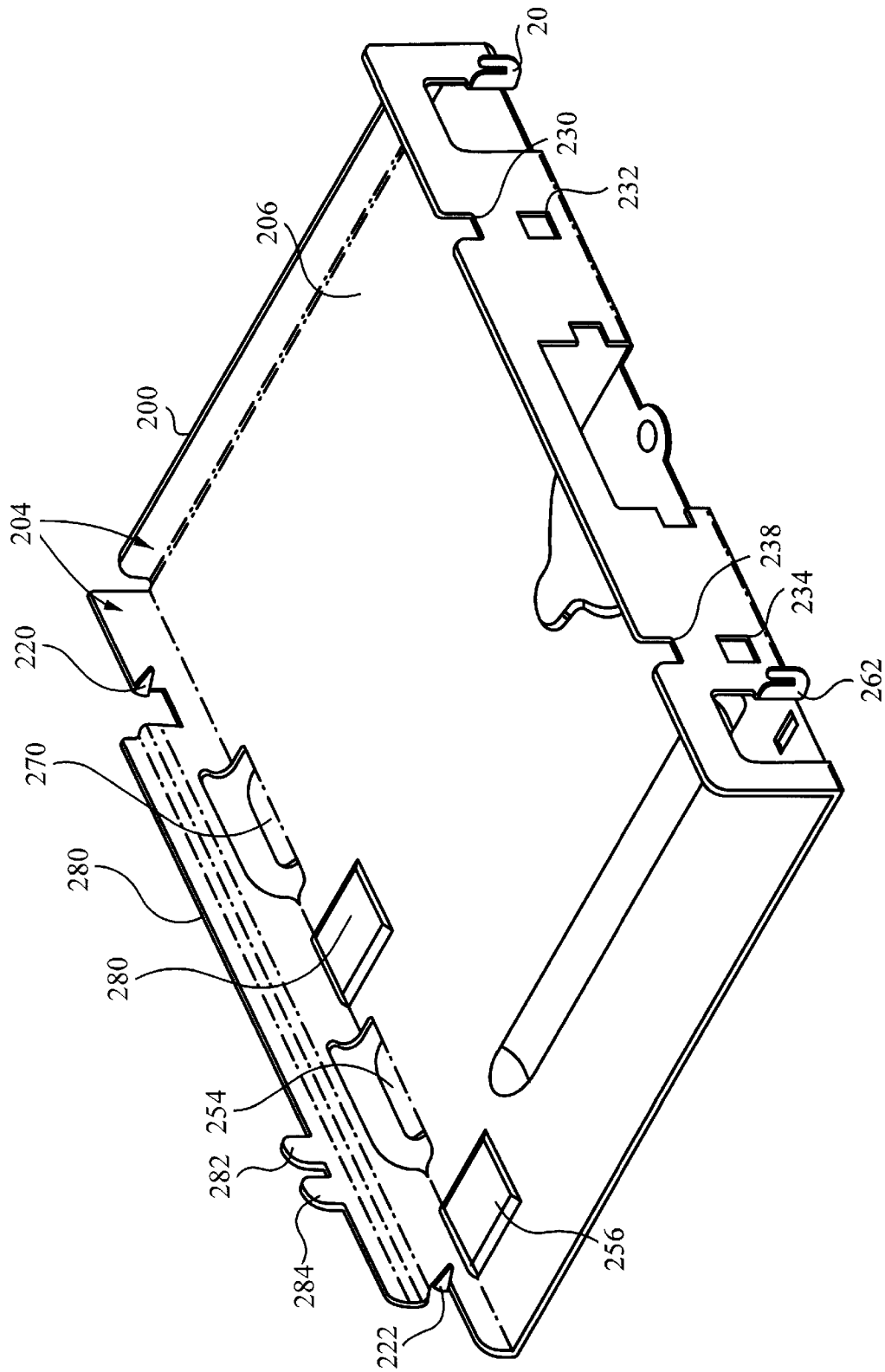
FIG. 3 illustrates a right perspective view of a bracket body of the preferred embodiment of the present invention.

The bracket body 206 of the bracket 200 is illustrated in FIG. 3. The peripheral electronic component is not shown in FIG. 3, therefore the first inwardly directed protrusions 220 and 222 are more clearly visible. In addition, portions of the inside surface 204 and the outside surface 202 of the bracket 200 are shown. The bracket body 206 is preferably configured with one or more openings 232 and 234 and one or more notches 236 and 238.

Figure 4:
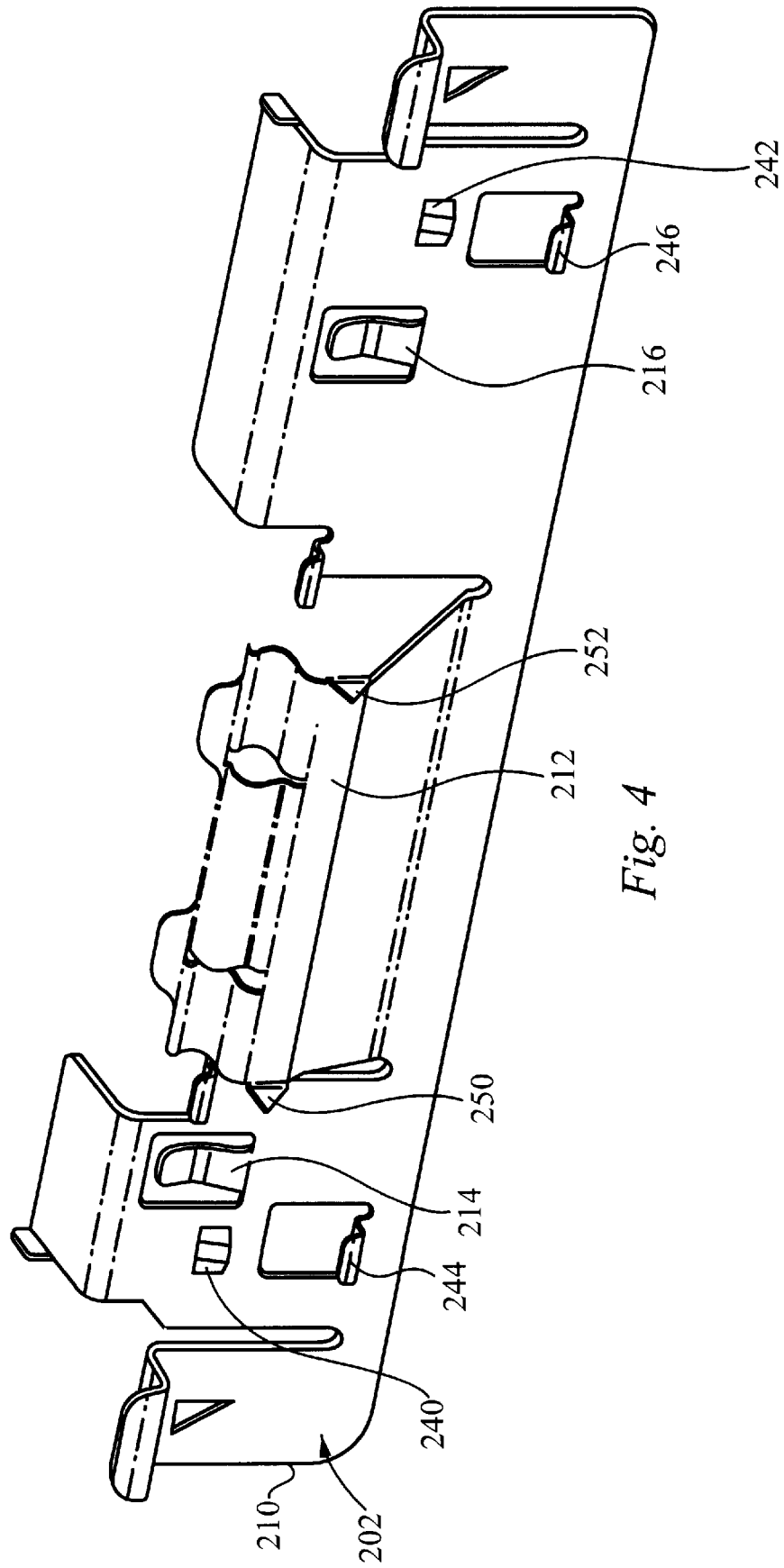
FIG. 4 illustrates a left perspective view of a spring clip of the preferred embodiment for the present invention.

A left perspective view of the spring clip 210 is illustrated in FIG. 4. The outwardly spring-urged protrusions 250 and 252 located on the outward spring portion 212 of the spring clip 210 are visible. The spring clip 210 is preferably configured with attachment protrusions 240 and 242 and L-shaped tabs 244 and 246. The spring clip 210 is preferably attached to the bracket body 206 by inserting the attachment protrusions 240 and 242 through the openings 232 and 234 and resting the notches 236 and 238 within the L-shaped tabs 244 and 246. The spring clip 210 is preferably provided with one or more inward spring portions 214 and 216. When at rest, the inward spring portions 214 and 216 of the spring clip 210 are protruding such that when outward pressure is applied to the inward spring portions 214 and 216, the spring clip 210 deforms and provides opposing inward pressure by its inherent attempt to return to its 'at rest' position.

Figure 5:
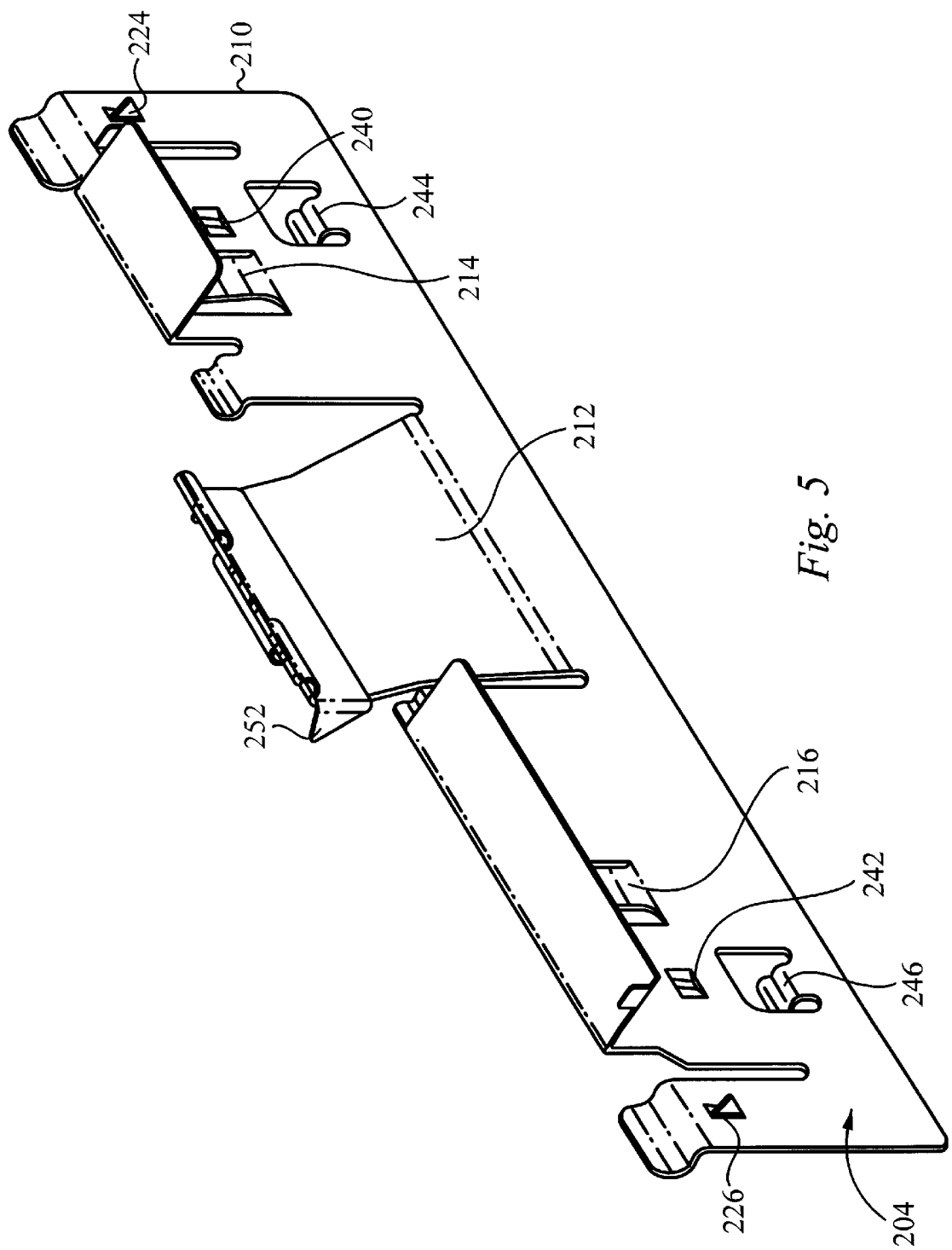
FIG. 5 illustrates a right perspective view of the spring clip of the preferred embodiment of the present invention.

FIG. 5 illustrates a right perspective view of the spring clip 210. A portion of the inside surface 204 of the bracket 200 is shown. Furthermore, FIG. 5 shows a plurality of second inwardly directed protrusions 224 and 226 which are preferably included on the spring clip 210. In operation, the first inwardly directed protrusions 220 and 222 are aligned with the first apertures 120 and 122, the bracket body 206 is flexed allowing the first inwardly directed protrusions 220 and 222 to be inserted into the first apertures 120 and 122. After insertion of the first inwardly directed protrusions 220 and 222 into the first apertures 120 and 122 and upon further rotation of the bracket 200 relative to the peripheral electronic component 100 to enclose it therein, the flattened protrusions 254 and 256 make firm contact with and provide pressure against the location markers, not visible, on the exterior enclosure 110, the second inwardly directed protrusions 224 and 226 are aligned with and inserted into the second apertures, not visible, and the inward spring portions 214 and 216 apply pressure against the opposite face of the peripheral electronic component 100 to firmly hold the first inwardly directed protrusions 220 and 222 in the first apertures 120 and 122. Preferably the second inwardly directed protrusions 224 and 226 are sufficiently long to remain engaged within the second apertures of the exterior enclosure 110 when the inward spring portions 214 and 216 apply inward pressure against the peripheral electronic component 100.

In addition, the flattened protrusions press down on the location markers while preferably at least some of the first and second inwardly directed protrusions 220, 222, 224, or 226 press up on screw threads of the first or second apertures, respectively. As a result, the bracket 200, in effect, clamps the peripheral electronic component 100 and reduces or prevents vertical movement of the peripheral electronic component 100 with respect to the bracket 200. It should be noted that the present invention is described relative to a horizontal installation of the peripheral electronic component 100, for the purposes of illustration. However, it will be obvious to one of ordinary skill in the art that the present invention is also suited for installation of the peripheral electronic component 100 horizontally or vertically as well as at an angle. Therefore, the terms up, down and vertical to describe the clamping action of the bracket 200 with respect to the peripheral electronic component 100 are intended to be relative.

Inward pressure from the inward spring portions 214 and 216 not only pushes the second inwardly directed protrusions 224 and 226 into the second apertures. but also pushes the peripheral electronic component 100 toward the first inwardly directed protrusions 220 and 222. The preferred embodiment of the present invention includes a bracket body 206 and first inwardly directed protrusions 220 and 222 that are rigid. Therefore, the bracket body 206 does not deform significantly as a result of inward pressure on the peripheral electronic component 100 from the inward spring portions 214 and 216. As a result, the first apertures 120 and 122 are pushed onto the first inwardly directed protrusions 220 and 222 when the inward spring portions 214 and 216 apply inward pressure to the peripheral electronic component 100. In operation, the preferred embodiment of the present invention uses direct spring urged tension to hold the second inwardly directed protrusions 224 and 226 in the second apertures. In addition, a resulting opposite spring urged tension between the bracket body 206 and the peripheral electronic component 100 holds the first inwardly directed protrusions 220 and 222 within the first apertures 120 and 122. This occurs even though only the second inwardly directed protrusions 224 and 226 are constructed on the spring clip 210 while the first inwardly directed protrusions 220 and 222 are preferably rigid with respect to the bracket body 206. In this way, the peripheral electronic component 100 is held securely in the bracket 200.

Figure 6:
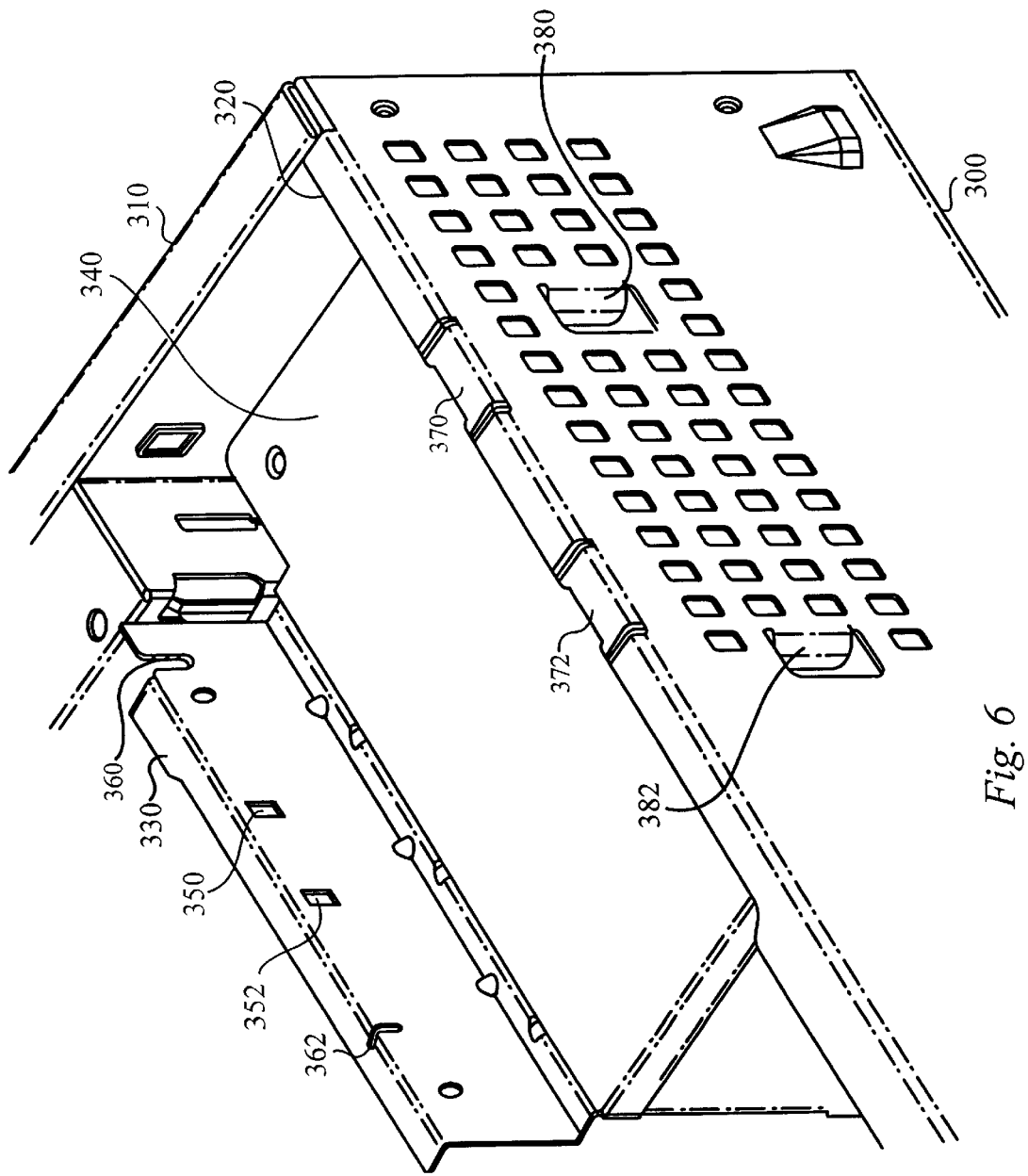
FIG. 6 illustrates a right perspective view of an electronic system incorporating first and second walls of the preferred embodiment of the present invention.
Figure 7:
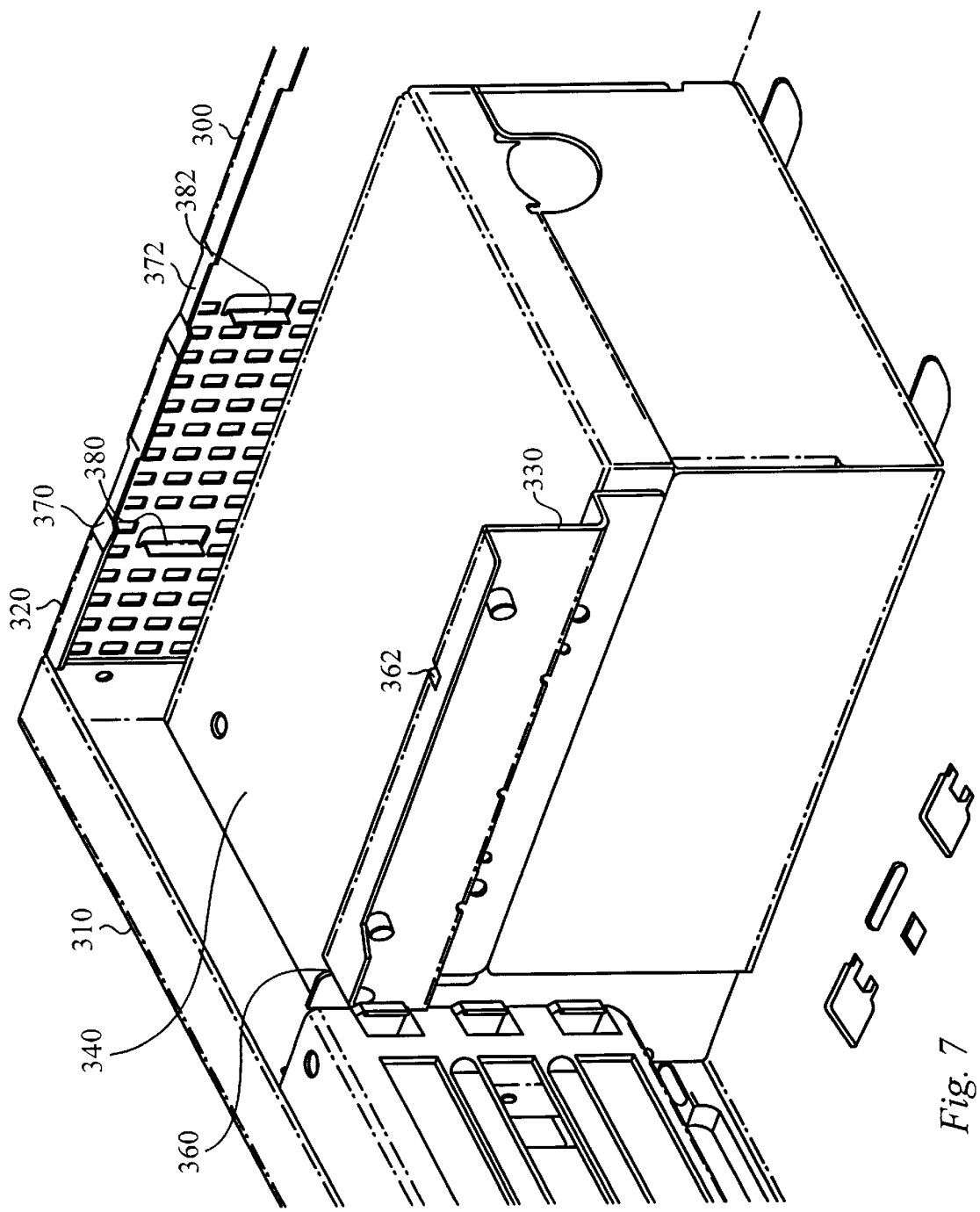
FIG. 7 illustrates a left perspective view of an electronic system incorporating the first and second walls of the preferred embodiment of the present invention.
Figure 8:
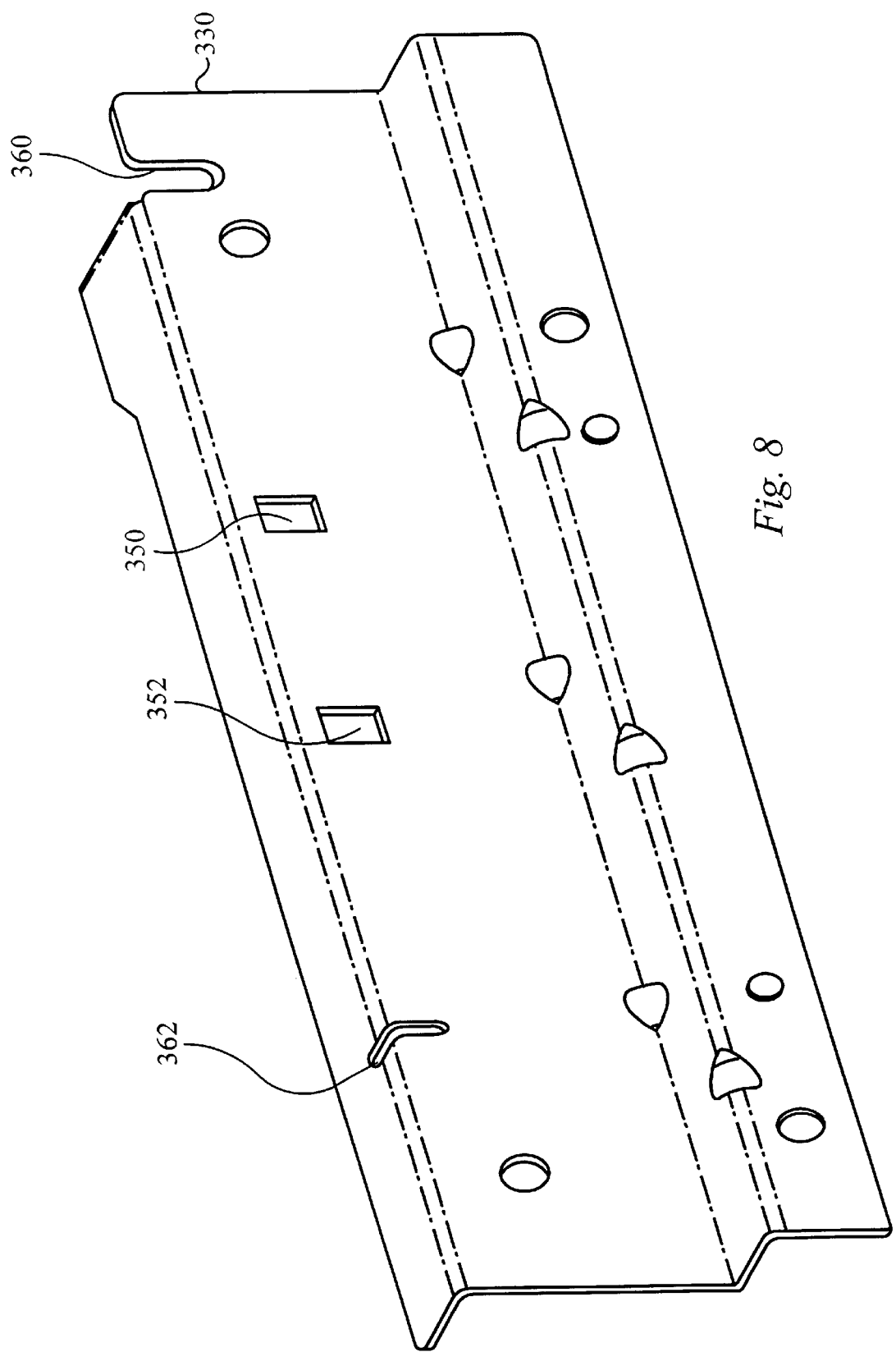
FIG. 8 illustrates a right perspective view of the second wall of the preferred embodiment of the present invention.

FIG. 6 illustrates a right perspective view of an electronic system 300 of the present invention. Similarly, FIG. 7 shows a left perspective view of the electronic system 300 of the present invention. The electronic system preferably includes a chassis 310 with a first wall 320 and a parallel and opposing second wall 330. The first and second walls 320 and 330 are attached to the chassis 310. In addition, the first wall 320 preferably includes one or more indentations 370 and 372 and at least one chassis protrusion 380 and 382. The location of the indentations 370 and 372 correspond to the location of the tab-shaped protrusions 270 and 272. The location of the chassis protrusions 380 and 382 correspond to the location of the horizontal edge 280. In addition, the location of the chassis protrusion 382 also corresponds to the location of the closely spaced tabs 282 and 284. The second wall 330 preferably includes a plurality of third apertures 350 and 352 and preferably at least one tapered slot 360 and 362. The locations of the third apertures 350 and 352 correspond to the locations of the outwardly spring-urged protrusions 250 and 252. The locations of the tapered slots 360 and 362 correspond to the locations of the C-shaped protrusions 260 and 262. The second wall 330 is illustrated in FIG. 8.

Figure 9:
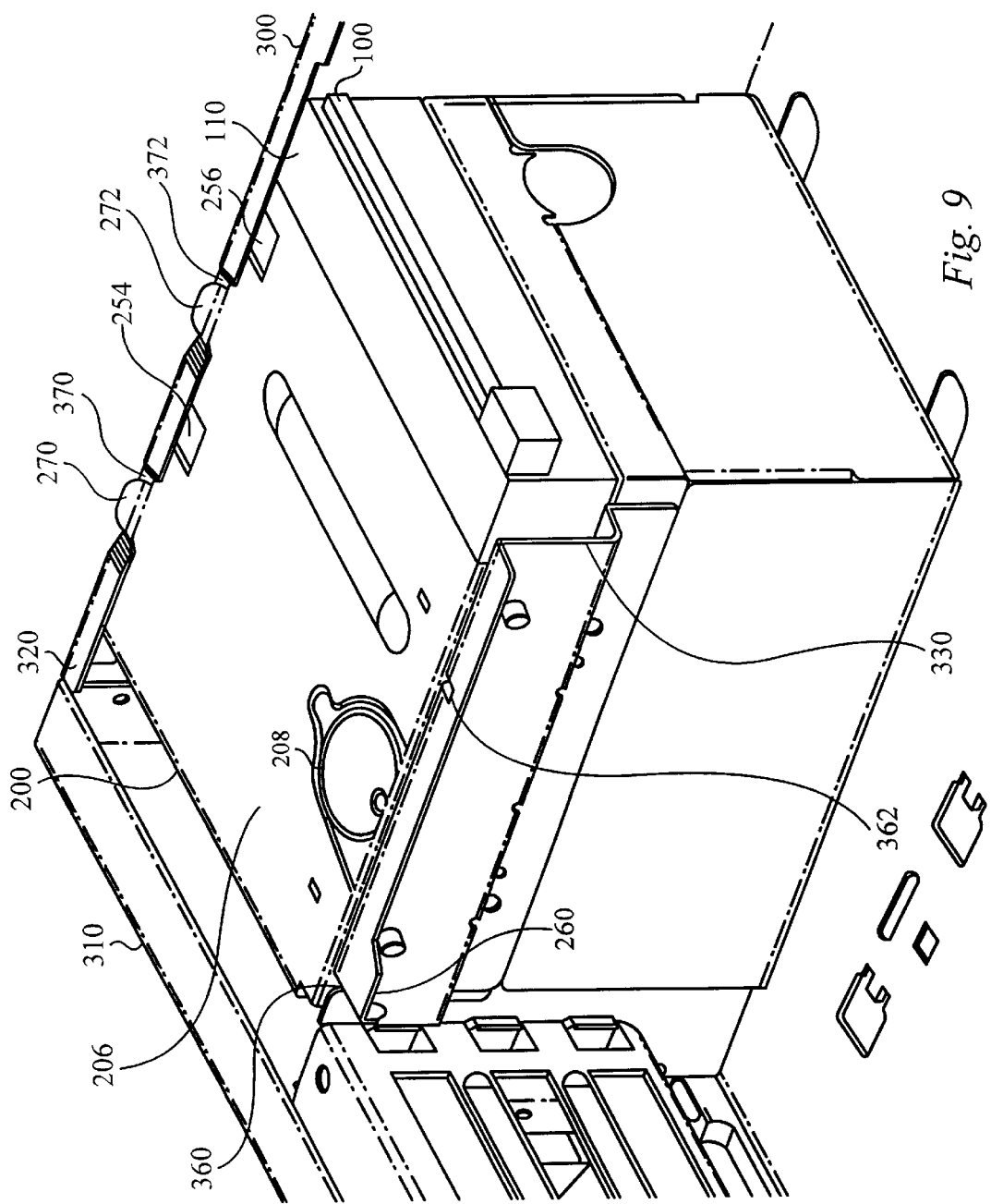
FIG. 9 illustrates a left perspective view of the preferred embodiment of the present invention in combination with a peripheral electronic component.
Figure 10:
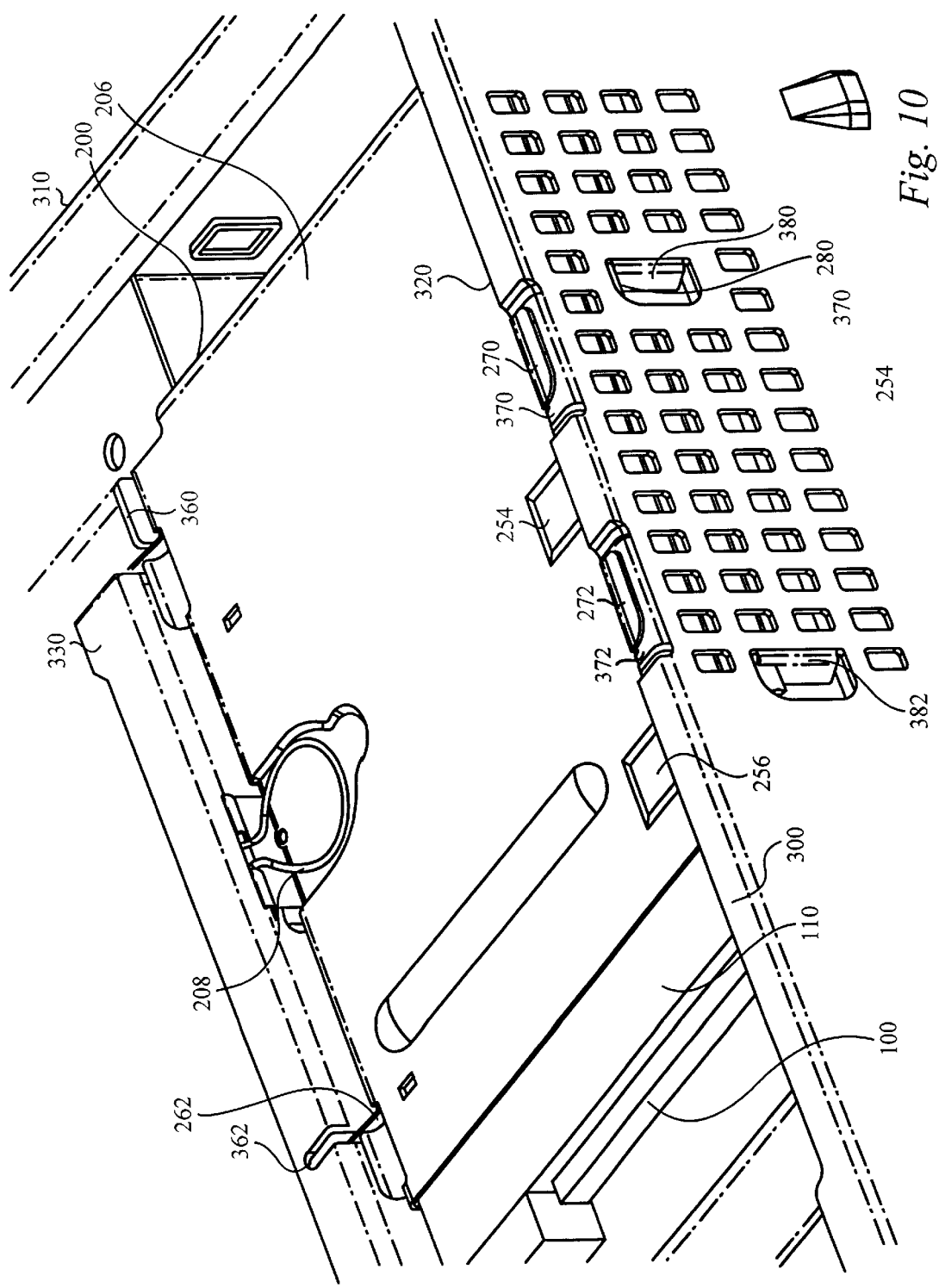
FIG. 10 illustrates an enlarged right perspective view of the preferred embodiment of the present invention in combination with a peripheral electronic component.

The peripheral electronic component 100, with the bracket 200 attached, as shown in FIG. 2, is preferably installed in a recess 340 of the electronic system 300. FIG. 9 shows the electronic system 300 with the bracket 200 and peripheral electronic component 100 installed in the recess 340. FIG. 10 illustrates an enlarged view of the bracket 200 and the peripheral electronic component 100 installed in the electronic system 300.

In operation, the tab-shaped protrusions 270 and 272 are aligned with and then inserted into the indentations 370 and 372. The horizontal edge 280 is supported on the chassis protrusions 380 and 382 with one of the chassis protrusions 382 fit between the closely spaced tabs 282 and 284. The closely spaced tabs 282 and 284 fit tightly around one of the chassis protrusions 382 to reduce or eliminate any vibration or lateral movement of the peripheral electronic component 100 with respect to the electronic system 300. The peripheral electronic component 100, with the bracket 200 attached, is rotated relative to the electronic system 300 toward the second wall 330 until the outwardly spring-urged protrusions 250 and 252 are aligned above the third apertures 350 and 352 and the C-shaped protrusions 260 and 262 are aligned above the tapered slots 360 and 362. Once in this position, pressure is applied to the bracket 200 to push the peripheral electronic component 100 into the recess 340. The pressure applied to the bracket 200 in conjunction with the second wall 330 causes the outward spring portion 212 to be inwardly deformed to allow the outwardly spring-urged protrusions 250 and 252 to be inserted into the third apertures 350 and 352. In addition, the C-shaped tabs 260 and 262 are inserted into the tapered slots 360 and 362. After the outwardly spring-urged protrusions 250 and 252 are inserted into the third apertures 350 and 352, the outward spring portion 212 applies pressure against the second wall 330 to firmly hold the outwardly spring-urged protrusions 250 and 252 in the third apertures 350 and 352. This deformation of the spring clip 210 also provides inward pressure to the second inwardly directed protrusions 224 and 226 to firmly hold the second inwardly directed protrusions 224 and 226 within the second apertures, not visible, of the peripheral electronic component 100. In this way, the bracket 200 and the peripheral electronic component 100 are securely attached to the electronic system 300.

The spring-urged pressure used to attach the peripheral electronic component 100 to the electronic system 300 also reduces or eliminates the transmission of vibration between the peripheral electronic component 100 and the electronic system 300 since the outward spring portion 212 can deform to absorb vibration. In addition, one or more of the bracket 200, the spring clip 210, the first and second walls 320 and 330, the first and second inwardly directed protrusions 220, 222, 224 and 226 and the outwardly spring-urged protrusions 250 and 252 are preferably constructed of an electrically conductive material, for example sheet metal, steel or stainless steel or other electrically conductive material, or provided with a conductive metallic paint or coating to provide a method of electrically coupling the exterior enclosure 110 of the peripheral electronic component 100 to the ground of the electronic system 300 using the standard mounting screw holes 120 and 122. Since the apparatus of the present invention uses multiple contact points, and provides a firm fit, the electrical coupling or grounding provided by the present invention is very reliable.

The preferred embodiment of the present invention further provides for a toolless release means for allowing the peripheral electronic component 100, with the bracket 200 attached, to be quickly and easily removed from the electronic system 300. The toolless release means preferably consists of the pull ring 208 attached to the outward spring portion 212 and functions as a manually operable retractor. In operation, inward pressure is applied to the outward spring portion 212 by pulling on the pull ring 208. The toolless release means is preferably engaged by pulling the pull ring 208 to deform the outward spring portion 212 inwardly and away from the second wall 330. This allows the outwardly spring urged protrusions 250 and 252 to be quickly and easily released from the third apertures 350 and 352. In this way. The amount of time needed to troubleshoot, repair and replace peripheral electronic components is decreased since no time is needed to advance and withdraw any mounting screws. In addition, no screw drivers or other tools are required to install or remove the peripheral electronic component.

By using the screwless technique of the present invention to attach a peripheral electronic component to an electronic system, a manufacturer can reduce the number of times the chassis of an electronic system is touched and the length of time each chassis is touched. Further, the ease of using the technique of the present invention for installing and removing peripheral electronic components allows a manufacturer to confidently offer end-user upgradable electronic systems even to users with no technical training or who may not have tools available for removing, installing or upgrading peripheral electronic components.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the preferred embodiment chosen for illustration without departing from the spirit and scope of the invention.

Specifically, it will be apparent to one of ordinary skill in the art that the present invention, an apparatus for attaching a peripheral electronic component to an electronic system, could be implemented in several different ways. For example, the preferred embodiment of FIG. 9 illustrates the apparatus of the present invention used to attach the peripheral electronic component to the inside of the electronic system. One of ordinary skill in the art will find it apparent to use the apparatus of the present invention to attach the peripheral electronic component to the outside of the electronic system.

In addition, FIG. 9 illustrates the apparatus of the present invention used to attach the peripheral electronic component horizontally within the electronic system. One of ordinary skill in the art would be motivated to use the apparatus of the present invention to attach the peripheral electronic component vertically within the electronic system in order to conserve space. Further, FIG. 6 illustrates the apparatus of the present invention configured with two parallel opposing walls. It will be apparent to one of ordinary skill in the art to utilize the apparatus of the present invention configured with other than parallel opposing walls. For example, the two walls could be configured perpendicular to each other. FIGS. 3 and 4 illustrate the preferred embodiment of the present invention with the bracket comprising multiple pieces. It will be apparent to one of ordinary skill in the art to make the apparatus of the present invention using one-piece construction. Also in the preferred embodiment, the inward spring portions 214 and 216 and the outward spring portion 12 are used to, among other things, provide spring-urged pressure on the first and second inwardly directed protrusions 220, 222, 224 and 226 and the outwardly spring-urged protrusions 250 and 252. In an alternate embodiment of the present invention, the first and second inwardly directed protrusions 220, 222, 224, and 226 and the outwardly spring-urged protrusions 250 and 252 are self spring-urged.

In FIG. 1, the apparatus of the present invention is illustrated with toolless release means in the form of a pull ring attached to the outwardly spring-urged protrusions. One of ordinary skill in the art will find it apparent to use an integral tab on the outwardly spring-urged protrusions as an alternate manually operable retractor.

The preferred embodiment of the present invention, as illustrated in FIGS. 9 and 10, includes a peripheral electronic component 100 held within a bracket 200 and attached to an electronic system 300. However, an alternate embodiment of the present invention includes a peripheral electronic component 100 attached directly to an electronic system 300 without a bracket. In this alternate embodiment, the exterior enclosure 110 of the peripheral electronic component 100 includes one or more of the features of the present invention such as the outwardly spring-urged protrusions 250 and 252, the tab shaped protrusions 270 and 272, the C-shaped protrusions 260 and 262, and the toolless release means 208 to removably attach the peripheral electronic component 100 directly to the electronic system 300.

What is claimed is:

1. An apparatus for attaching a peripheral electronic component to an electronic system without screws, wherein the peripheral electronic component has an exterior enclosure which includes a plurality of first apertures in predetermined first locations and the electronic system includes a plurality of second apertures in predetermined second locations, the apparatus comprising:

a bracket for mounting to a portion of the exterior enclosure, the bracket having an inside surface and an outside surface, a plurality of first protrusions positioned corresponding to the first locations and for engaging the first apertures, wherein the first protrusions are spring urged toward the peripheral electronic component for mounting the bracket to the peripheral electronic component without screws and a plurality of second protrusions corresponding to the second locations and for engaging the second apertures, wherein the second protrusions are spring urged toward the electronic system for mounting the bracket and the peripheral electronic component to the electronic system without screws.

2. The apparatus, as claimed in claim 1, further comprising a conduction means for electrically coupling the exterior enclosure to the electronic system.

3. The apparatus, as claimed in claim 1, further comprising a toolless release means for removing the peripheral electronic component from the electronic system including a manually operable retractor for the second protrusions.

4. The apparatus, as claimed in claim 1, wherein the first protrusions are inwardly spring urged and located on the inside surface and the second protrusions are outwardly spring urged and located on the outside surface.

5. An apparatus for attaching a peripheral electronic component to an electronic system without screws, wherein the peripheral electronic component has an exterior enclosure which includes a plurality of first apertures in predetermined first locations and a plurality of second apertures in predetermined second locations and the electronic system includes a plurality of third apertures in predetermined third locations, the apparatus comprising:

a bracket for mounting to a portion of the exterior enclosure, the bracket having an inside surface and an outside surface, a plurality of first protrusions positioned corresponding to the first locations and for engaging the first apertures, wherein the first protrusions are spring urged toward the peripheral electronic component for mounting the bracket to the peripheral electronic component without screws, a plurality of second protrusions positioned corresponding to the second locations and for engaging the second apertures, wherein the second protrusions are rigid and are directed toward the peripheral electronic component for mounting the bracket to the peripheral electronic without screws, and a plurality of third protrusions corresponding to the third locations and for engaging the third apertures, wherein the third protrusions are spring urged toward the electronic system for mounting the bracket and the peripheral electronic component to the electronic system without screws.

6. The apparatus as claimed in claim 5, wherein the second protrusions are located opposite the first protrusions whereby the second apertures and the second protrusions are pushed toward each other when the first protrusions are engaged in the first protrusions.

7. An apparatus for attaching a peripheral electronic component to an electronic system without screws, wherein the peripheral electronic component has an exterior enclosure which includes a plurality of first apertures in predetermined first locations, the apparatus comprising:
   a. a chassis for mounting in the electronic system, the chassis having a plurality of second apertures in predetermined second locations; and
   b. a bracket for mounting to a portion of the exterior enclosure, the bracket having an inside surface and an outside surface, a plurality of first protrusions positioned corresponding to the first locations and for engaging the first apertures, wherein the first protrusions are inwardly spring urged toward the peripheral electronic component for mounting the bracket to the peripheral electronic component without screws and a plurality of outwardly spring urged second protrusions corresponding to the second locations and for engaging the second apertures for mounting the bracket and the peripheral electronic component to the chassis without screws.

8. The apparatus, as claimed in claim 7, further comprising a conduction means for electrically coupling the exterior enclosure to the electronic system.

9. The apparatus, as claimed in claim 7, further comprising a toolless release means for removing the peripheral electronic component from the electronic system including a manually operable retractor for the second protrusions.

10. The apparatus, as claimed in claim 7, wherein the chassis includes a first wall and a second wall.

11. The apparatus, as claimed in claim 10, wherein the second wall is oriented opposing and parallel to the first wall.

12. The apparatus, as claimed in claim 11, further comprising;
   a. a horizontal edge on the bracket;
   b. a tab-shaped protrusion on the bracket;
   c. a C-shaped protrusion on the bracket;
   d. a chassis protrusion on the first wall for supporting the horizontal edge;
   e. an indentation on the first wall for accepting the tab-shaped protrusion; and
   f. a tapered slot on the second wall for accepting the C-shaped protrusion.

13. The apparatus, as claimed in claim 12, further comprising at least two closely spaced tabs on the horizontal edge for engaging on each side of the chassis protrusion thereby reducing lateral movement of the bracket with respect to the chassis.

14. The apparatus, as claimed in claim 13, where the outwardly spring urged protrusion is configured to absorb vibration thereby reducing the transmission of vibration between the peripheral electronic component and the electronic system.

15. An apparatus for attaching a peripheral electronic component to an electronic system, wherein the peripheral electronic component has an exterior enclosure which includes a plurality of first apertures in predetermined first locations the apparatus comprising:
   a. a chassis attached to the electronic system, the chassis having a first wall and a parallel opposing second wall, the first wall having a chassis protrusion and an indentation, the second wall having a tapered slot and a second aperture in a second predetermined location; and
   b. a bracket coupled to the first wall and the second wall, the bracket having;
      (1) a horizontal edge which rests on the chassis protrusion;
      (2) a plurality of inwardly spring urged first protrusions positioned corresponding to the first locations and for engaging the first apertures;
      (3) an outwardly spring urged second protrusion positioned corresponding to the second location and for engaging the second aperture;
      (4) a tab shaped protrusion which rests on the indentation; and
      (5) a C-shaped protrusion which rests in the tapered slot.

16. The apparatus, as claimed in claim 15, wherein the horizontal edge further includes tabs closely located on either side of the chassis protrusion thereby reducing lateral movement of the bracket with respect to the chassis.

17. The apparatus, as claimed in claim 16, wherein the outwardly spring urged protrusion is configured to absorb vibration thereby reducing the transmission of vibration between the peripheral electronic component and the electronic system.

18. An apparatus for attaching a peripheral electronic component to an electronic system, wherein the peripheral electronic component has an exterior enclosure which includes a plurality of first apertures in predetermined first locations and a plurality of second apertures in predetermined second locations, the apparatus comprising:
   a. a chassis attached to the electronic system, the chassis having a first wall and a parallel opposing second wall, the first wall having a chassis protrusion and an indentation, the second wall having a tapered slot and a third aperture in a third predetermined location; and
   b. a bracket coupled to the first wall and the second wall, the bracket having;
      (1) a horizontal edge which rests on the chassis protrusion;
      (2) a plurality of inwardly spring urged first protrusions positioned corresponding to the first locations and for engaging the first apertures;
      (3) a plurality of inwardly directed second protrusions positioned corresponding to the second locations and for engaging the second apertures;
      (4) an outwardly spring urged third protrusion positioned corresponding to the third location and for engaging the third aperture;
      (5) a tab shaped protrusion which rests on the indentation; and
      (6) a C-shaped protrusion which rests in the tapered slot.

19. The apparatus as claimed in claim 18, wherein the second protrusions are rigid relative to the bracket and are located opposite the first protrusions for and wherein the first protrusions are flexible relative to the bracket and configured for creating a spring force to urge the first protrusions and the second protrusions toward each other.

20. An improved peripheral electronic component for attaching to an electronic system without screws, wherein the electronic system includes a plurality of apertures in predetermined locations, the improved peripheral electronic component comprising:
   an exterior enclosure having a plurality or protrusions positioned corresponding to the predetermined locations and for engaging the apertures, wherein the protrusions are outwardly spring-urged toward the electronic system for mounting the peripheral electronic component to the electronic system without screws.

21. The improved peripheral electronic component as claimed in claim 20, further comprising a conduction means for electrically coupling the peripheral electronic component to the electronic system.

22. The improved peripheral electronic component as claimed in claim 20, wherein the exterior enclosure further includes a toolless release means for removing the peripheral electronic component from the electronic system including a manually operable retractor for the protrusions.

23. An electronic subsystem for attaching to an electronic system without screws, wherein the electronic system includes a plurality of first apertures in predetermined first locations, the electronic subsystem comprising:
   a. a peripheral electronic component with an exterior enclosure which includes a plurality of second apertures in predetermined second locations; and
   b. a bracket mounted to a portion of the exterior enclosure, the bracket having a plurality of first protrusions positioned corresponding to the first locations and for engaging the first apertures.

24. The electronic subsystem, as claimed in claim 23, wherein the bracket is screwed to the exterior enclosure.

25. The electronic subsystem, as claimed in claim 23, wherein the bracket further includes a plurality of second protrusions corresponding to the second locations and engaging the second apertures wherein the second protrusions are spring urged toward the peripheral electronic component thereby mounting the peripheral electronic component to the bracket without screws.

26. An electronic system for attaching a peripheral electronic component using a bracket, wherein the peripheral electronic component includes a plurality of first apertures in predetermined first locations and the bracket includes a plurality of spring urged first protrusions positioned corresponding to the first locations and a plurality of spring urged second protrusions positioned in predetermined second locations, the electronic system comprising a chassis having a plurality of second apertures positioned corresponding to the second locations and for engaging the second protrusions for mounting the bracket and the peripheral electronic component to the electronic system.

27. An electronic system for attaching a peripheral electronic component without screws, wherein the peripheral electronic component includes a plurality of apertures in predetermined locations, the electronic system comprising:
   a. a chassis; and
   b. a plurality of protrusions attached to the chassis, positioned corresponding to the locations and for engaging the apertures wherein the protrusions are spring urged toward the peripheral electronic component for mounting the peripheral electronic component to the electronic system without screws.

28. An electronic system comprising:
   a. a peripheral electronic component including a plurality of first apertures in predetermined first locations;
   b. a chassis including a plurality of second apertures in predetermined second locations; and
   c. a bracket including:
      (1) a plurality of first protrusions positioned corresponding to the first locations and engaging the first apertures wherein the first protrusions are spring urged toward the peripheral electronic component thereby attaching the bracket to the peripheral electronic component without screws; and
      (2) a plurality of second protrusions positioned corresponding to the second locations and engaging the second apertures wherein the second protrusions are spring urged toward the chassis thereby attaching the peripheral electronic component and the bracket to the chassis without screws.

29. The electronic system, as claimed in claim 28, wherein the bracket further comprises:
   a. a horizontal edge;
   b. a tab-shaped protrusion attached to the bracket; and
   c. a C-shaped protrusion attached to the bracket.

30. The electronic system, as claimed in claim 29, wherein the chassis further comprises:
   a. a first wall attached to the chassis, the first wall including:
      (1) a chassis protrusion supporting the horizontal edge; and
      (2) an indentation engaged with the tab-shaped protrusion; and
   b. a second wall attached to the chassis and positioned opposite and parallel to the first wall, the second wall including:
      (1) a tapered slot for engaging the C-shaped protrusions; and
      (2) wherein the second protrusions are provided on the second wall of the chassis.

31. An electronic system comprising:
   a. a chassis including a plurality of apertures in predetermined locations; and
   b. a peripheral electronic component including a plurality of protrusions positioned corresponding to the locations and engaging the apertures, wherein the protrusions are spring urged toward the chassis thereby attaching the peripheral electronic component to the chassis without screws.

32. An improved method of attaching a peripheral electronic component to a bracket without screws wherein the peripheral electronic component has an exterior enclosure which includes a plurality of apertures in predetermined locations and the bracket includes a plurality of inwardly spring urged protrusions corresponding to the locations, the improved method comprising the steps of:
   a. retracting the spring urged protrusions;
   b. aligning the spring urged protrusions with the apertures; and
   c. releasing the spring urged protrusions into the apertures.

33. An improved method of attaching a peripheral electronic component to an electronic system without screws, the peripheral electronic component having a plurality of first apertures at predetermined first locations, and the electronic system having a plurality of second apertures at predetermined second locations, the improved method comprising the steps of:
   a. providing a bracket having a plurality of inwardly spring urged first protrusions corresponding to the first locations and a plurality of outwardly spring urged second protrusions corresponding to the second locations
   b. retracting the first protrusions;
   c. aligning the first protrusions with the first apertures;
   d. releasing the first protrusions into the first apertures, thereby attaching the bracket to the peripheral electronic component;

e. aligning the bracket in the electronic system; and f. rotating the bracket past a position where the second protrusions are retracted and inserted into the second apertures, thereby attaching the peripheral electronic component with the bracket attached to the electronic system.

34. The improved method as claimed in claim 33, further comprising the step of electrically coupling the peripheral electronic component to the electronic system.

35. The improved method as claimed in claim 33, further comprising the step of removing the peripheral electronic component with the bracket attached from the electronic system by retracting the second protrusions and removing the second protrusions from the second apertures.

36. An improved method of attaching an electronic subsystem to an electronic system without screws, the electrical subsystem having a plurality of outwardly spring-urged protrusions in predetermined locations and the electrical system having a plurality of apertures corresponding to the locations, the improved method comprising the steps of:

a. aligning the electronic subsystem within the electronic system;
   b. retracting the outwardly spring-urged protrusions; and
   c. releasing the outwardly spring-urged protrusions into the apertures.

37. The improved method as claimed in claim 36, wherein the step of retracting the outwardly spring urged protrusions comprised the step of rotating the electronic subsystem past a position where the outwardly spring urged protrusions are retracted and inserted into the apertures.

38. The improved method as claimed in claim 36, further comprising the steps of retracting the outwardly spring-urged protrusions and removing the outwardly spring-urged protrusions from the apertures to remove the electronic subsystem from the electronic system.

39. A computer comprising:

a. a peripheral electronic component including a plurality of first apertures in predetermined first locations and a plurality of second apertures in predetermined second locations;
   b. a chassis comprising:
      (1) a first wall attached to the chassis including at least one indentation and at least one chassis protrusion; and
      (2) a second wall attached to the chassis and oriented parallel and opposing the first wall including at least one tapered slot and a plurality of third apertures in predetermined third locations; and
   c. a bracket including an inside surface and an outside surface and comprising:
      (1) a bracket body including a horizontal edge with at least two closely spaced tabs corresponding in position to and engaging around the chassis protrusion, at least one tab-shaped protrusion corresponding in position to and engaging the indentation, at least one C-shaped protrusion positioned corresponding to and engaging the tapered slot, at least one notch, at least one opening and a plurality of inwardly directed first protrusions corresponding in location to the first locations and engaging the first apertures;
      (2) a spring clip attached to the bracket body comprising a plurality of inwardly directed second protrusions positioned corresponding to the second locations and engaging the second apertures, at least one attachment protrusion corresponding in position to and engaging the opening, at least one L-shaped tab positioned corresponding to and engaging the notch, at least one inward spring portion, at least one outward spring portion and a plurality of outwardly spring urged third protrusions positioned on the outward spring portion corresponding to the third locations and engaging the third apertures; and
      (3) a manually operable release means attached to the spring clip for retracting the outward spring portion to disengage the third protrusions from the third apertures thereby releasing the peripheral electronic component with the bracket attached from the chassis of the computer.

40. A bracket for attaching a peripheral electronic component to an electronic system wherein the peripheral electronic component includes a plurality of first apertures in predetermined first locations and a plurality of second apertures in predetermined second locations and the electronic system includes a plurality of third apertures in predetermined third locations, the bracket comprising:

a. a bracket body having an inside surface and an outside surface and including:
      (1) a horizontal edge with at least two closely spaced tabs;
      (2) at least one tab-shaped protrusion;
      (3) at least one C-shaped protrusion;
      (4) at least one notch;
      (5) at least one opening; and
      (6) a plurality of inwardly directed first protrusions corresponding in location to the first locations and engaging the first apertures for attaching the peripheral electronic component to the bracket;
   b. a spring clip attached to the bracket body comprising;
      (1) a plurality of inwardly directed second protrusions positioned corresponding to the second locations and engaging the second apertures for attaching the bracket to the peripheral electronic component;
      (2) at least one attachment protrusion corresponding in position to and engaging the opening;
      (3) at least one L-shaped tab positioned corresponding to and engaging the notch;
      (4) at least one inward spring portion;
      (5) at least one outward spring portion; and
      (6) a plurality of outwardly spring urged third protrusions positioned on the outward spring portion corresponding to the third locations and engaging the third apertures for mounting the peripheral electronic component and the bracket to the electronic system; and
   c. a manually operable release means attached to the spring clip for retracting the outward spring portion to disengage the third protrusions from the third apertures thereby releasing the peripheral electronic component with the bracket attached from the chassis of the computer.

* * * * *